United States Patent [19]
Ludovici et al.

[11] 3,982,151
[45] Sept. 21, 1976

[54] OPTICAL INFORMATION STORAGE SYSTEM

[75] Inventors: Bruno F. Ludovici, Owego, N.Y.; Gerhard K. Megla, Raleigh, N.C.

[73] Assignee: Corning Glass Works, Corning, N.Y.

[22] Filed: Nov. 19, 1973

[21] Appl. No.: 416,976

Related U.S. Application Data

[62] Division of Ser. No. 677,185, Oct. 23, 1967.

[52] U.S. Cl. ............................ 313/465; 350/160 P; 178/7.87
[51] Int. Cl.² ..................... H01J 29/12; H01J 29/89
[58] Field of Search ................... 313/91, 92 LF, 465

[56] References Cited
UNITED STATES PATENTS

| | | | |
|---|---|---|---|
| 3,226,589 | 12/1965 | Woodcock | 313/89 LF |
| 3,373,302 | 3/1968 | Barber | 313/92 LF |
| 3,400,214 | 9/1968 | Hamann | 350/160 P |
| 3,506,782 | 4/1970 | Anwyl | 313/465 X |
| 3,519,742 | 7/1970 | Bjelland | 313/92 LF |

*Primary Examiner*—Robert Segal
*Attorney, Agent, or Firm*—William J. Simmons, Jr.; Walter S. Zebrowski; Clarence R. Patty, Jr.

[57] ABSTRACT

An optical information storage system is disclosed which comprises a cathode ray tube having a photochromic fiber optic face plate on which data can be written by appropriate modulation and deflection of the electron beam. The readout function is accomplished by scanning appropriate portions of the phosphor by an electron beam of reduced intensity. Light which passes through the face plate is detected by a photocell.

4 Claims, 4 Drawing Figures

OPTICAL INFORMATION STORAGE SYSTEM

This is a division, of application Ser. No. 677,185, filed Oct. 23, 1967.

BACKGROUND OF THE INVENTION

This invention relates to cathode ray tubes having image storage capabilities. Two conventional types of cathode ray tube memories or image storage devices are the memoscope, a memory device utilizing electrostatic charge as the means of retaining information, and the dark trace tube, wherein the face plate of a cathode ray tube is provided with a layer of "dark trace" material such as an alkali halide compound.

Storage tubes based on the memoscope principle consist of a complicated apparatus which is difficult to manufacture and which is restricted in size to about 7 inches in diameter. The contrast in these tubes is not satisfactory, and brightness is quite limited. Furthermore, overlay apparatus used in conjunction with this type of tube is very complicated.

Dark trace storage tubes, such as that described in U.S. Pat. No. 3,148,281 granted to N. F. Fyler on Sept. 8, 1964, are also difficult to manufacture. A monocrystalline layer of a dark trace material such as potassium chloride must be formed on the inner surface of the cathode ray tube face plate, and a layer of phosphor is deposited over the monocrystalline layer. It is difficult to form such tubes in sizes greater than 7 inches in diameter. A serious disadvantage of this type of storage tube is that outgassing from the potassium chloride can adversely affect the cathode of the tube and thereby shorten its life. Furthermore, the opaque areas which form in the potassium chloride layer to increase the optical density thereof are highly susceptible to heat with the result that the image readily fades at room temperature.

SUMMARY OF THE INVENTION

It is, therefore, an object of this invention to provide an improved image storage type cathode ray tube.

Another object of this invention is to provide a storage tube which can be made in sizes comparable to those of conventional cathode ray tubes.

Still another object of this invention is to provide a storage tube which is simply and inexpensively manufactured.

Still another object of this invention is to provide a storage tube which retains an image for a relatively long period of time at room temperature.

A further object of this invention is to provide a storage tube which is compatible with image projection techniques which may include the projection of overlay information.

Briefly, the optical information storage and display device of this invention comprises a cathode ray tube having a face plate which consists of a first member formed of a plurality of glass optical fibers secured together in hermetically sealed fused side-by-side relation so that opposite ends of the fibers cooperate to define first and second faces. Each of the fibers includes a light conducting core consisting of a photochromic material having a selected refractive index and a cladding on the core consisting of a light transmitting material having a refractive index which is relatively lower than that of the core material. A layer of phosphor adjacent to the first face of the cathode ray tube face plate emits light which changes the optical density of the photochromic core material when energized by an electron beam impinging thereon.

Although information could be stored in a cathode ray tube face plate consisting of a homogenous plate of photochromic glass, the following advantages arise from the use of a fiber optic plate having photochromic cores. The light produced by the activated phosphor is confined within each fiber, thus forcing activation of the photochromic glass core over its entire length by multireflection and by direct transmission. Complete isolation from adjacent fibers is assured. No spreading or divergence of the light takes place, and the normally occuring inverse-square losses are therefore avoided. Higher contrast is thus obtainable. Furthermore, light from the activated phosphor interacts directly with the photochromic glass fiber cores without interface losses which would occur if a conventional fiber optic plate were used having a photochromic glass plate attached thereto.

Other objects, features, and advantages of this invention will become apparent during the course of the following detailed description and the attached drawings, on which, by way of example, only the preferred embodiments of this invention are illustrated.

DETAILED DESCRIPTION

Figure 1:
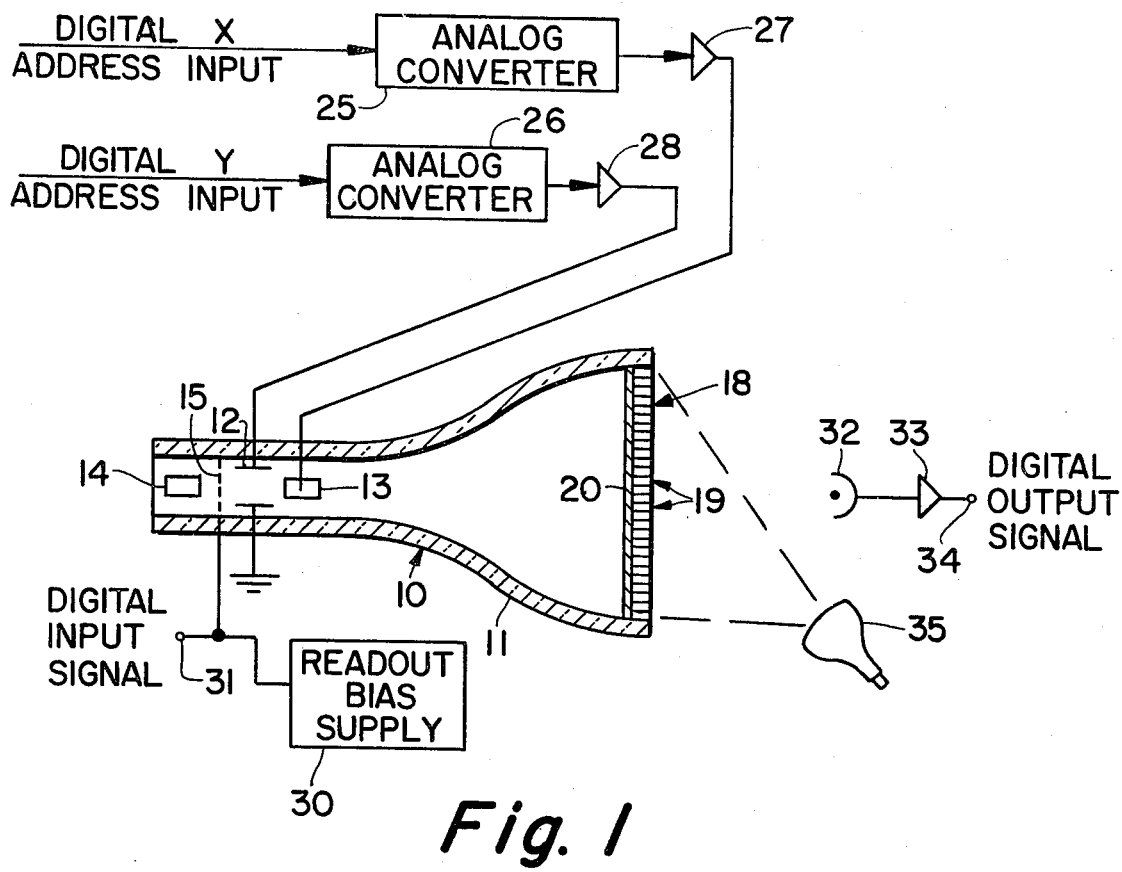
FIG. 1 is a schematic diagram of a digital memory system utilizing a cathode ray tube having a photochromic fiber optic face plate as the storage medium.
Figure 2:
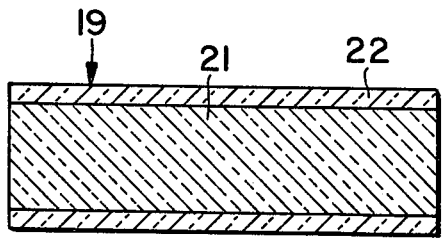
FIG. 2 is a side view of a light-conducting optical fiber of the type to be incorporated in the cathode ray tube face plate.

FIG. 1 is a schematic diagram of a cathode ray tube having a photochromic fiber optics face plate and the associated circuitry to operate this tube as a digital memory storage device. The tube 10 consists of a conventional envelope 11, vertical and horizontal deflection means 12 and 13 respectively, electron gun 14 and a beam intensity control electrode 15. The CRT face plate, which consists of a photochromic fiber optic plate, may be constructed in accordance with the teachings of U.S. Pat. No. 3,279,903 granted to W. P. Siegmund on Oct. 18, 1966. The face plate 18 is made up of many very fine individual fiber elements 19 (see FIG. 2) which are joined by fusion in side-by-side relation with each other, the ends of these fibers forming the two planar surfaces of the plate 18.

In conventional fiber optic face plate structures, the fiber elements 19 each consist of a core member 21 of a light transmitting medium having a relatively high index of refraction surrounded by a relatively thin cladding 22 of glass having a relatively low index of refraction. In accordance with this invention, the fiber elements 19 are provided with cores formed of a special glass which is selected primarily for its variable light transmission properties. Each core member 21 is made of photochromic glass which has the property of becoming less transparent if irradiated with blue or ultraviolet light, remaining unaffected by green light and becoming more transparent when irradiated by infrared, red or orange light. The characteristics and production of such glass are described in U.S. Pat. No. 3,208,860 granted to W. H. Armistead and S. D. Stookey on Sept. 28, 1965. The composition of the glass used for the core member 21 may be selected from the many examples set forth in the above described Armistead patent so long as it has a high index of refraction relative to that of the glass cladding 22. A glass composition essentially the same as that disclosed as Example 42 in the Armistead patent can be used as a core material when the cladding consists of a glass made in accordance with the teachings of U.S. Pat. No. 2,382,056 granted to H. P. Hood on Aug. 14, 1945. This combination of core and cladding glasses exhibits a desirable index of refraction ratio and comparable expansion characteristics.

The phosphor 20, which is applied to the inner surface of the face plate 18, is selected for the wavelength of light which it radiates when excited by the electron beam. The light radiated by the phosphor must be of a wavelength which changes the optical density of photochromic glass. A phosphor having the composition $ZCaO.MgO.ZSiO_2:0.05Ce$ has been successfully used. This is the formula for fast decay phosphor which is usually referred to as Akermanite. Cerium is the activator and has a concentration of about five mole percent. Ultraviolet light generated by the electron beam impinging upon the phosphor results in an increase in the optical density of the photochromic glass and therefore, provides the necessary contrast for information storage or display.

FIG. 1 includes a schematic representation of a digital memory system which utilizes tube 10. The particular location on the face plate 18 at which a spot of ultraviolet light is generated is determined by the deflection of the electron beam and hence by the horizontal and vertical address signals appearing on the input conductors. Incoming binary coded signals specifying the X and Y coordinates of the ultraviolet spot on the face plate are converted to analog voltages in the converters 25 and 26. The analog signals generated by the converters are applied by way of amplifiers 27 and 28 to the horizontal and vertical deflecting elements 13 and 12 respectively.

Information to be written into the face plate 18 may exist in the form of a serial binary code pulse group appearing at the terminal 31. As the address information deflects the electron beam, the digital signal at the terminal 31 determines whether or not a spot of light will be generated on the phosphor 20. Thus a series of darkened spots are generated in the face plate 18 corresponding to the digital input signal.

One method of reading out the information contained in the face plate 18 utilizes a photo cell 32, the output of which is coupled to an amplifier 33, with the digital output signal appearing at the amplifier output terminal 34. The readout function can be accomplished by reducing the intensity of the electron beam to a value which is much lower than the intensity required for writing. A readout bias supply 30 provides the proper bias voltage on the grid 15 to produce the low intensity reading beam. The low intensity beam scans the face plate 18 as instructed by the X and Y address input signals and generates light, the intensity of which is too low to affect the optical density of the photochromic glass. This light passes through the face plate at those points which have not been darkened by the ultraviolet light generated by the writing beam. The intensity of the reading electron beam may be about $10^{-6}$ or $10^{-7}$ the intensity of the writing beam. The light passed by the undarkened fibers of the face plate 18 is of adequate intensity to activate the photo cell 32 which then delivers a signal by way of the amplifier 33 to the output terminal 34.

Depending upon the kind of display (text, digital information, maps, curves, etc.) the erasing function can take various forms. Photochromic glass can be bleached by the application thereto of either heat or light having a wavelength in the red or infrared portion of the spectrum. Selective erasing could be accomplished by applying photon energy to the face plate 18 by a collimated red light having a wavelength in the 630 millimicron range. In FIG. 1 a source 35 floods the entire face plate 18 with a noncollimated bleaching light beam which simultaneously erases all information stored therein.

Figure 3:
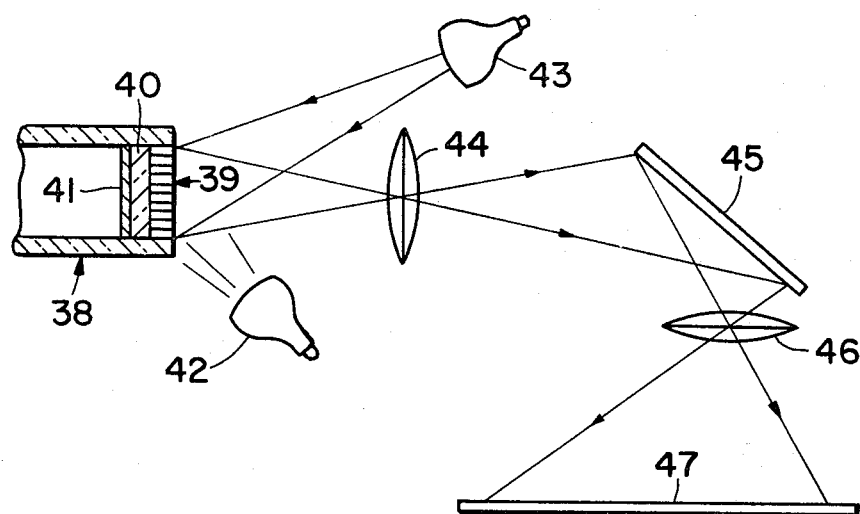
FIG. 3 is a schematic diagram which illustrates an optical system for projecting an enlarged image from a cathode ray tube face plate to a viewing screen.
Figure 4:
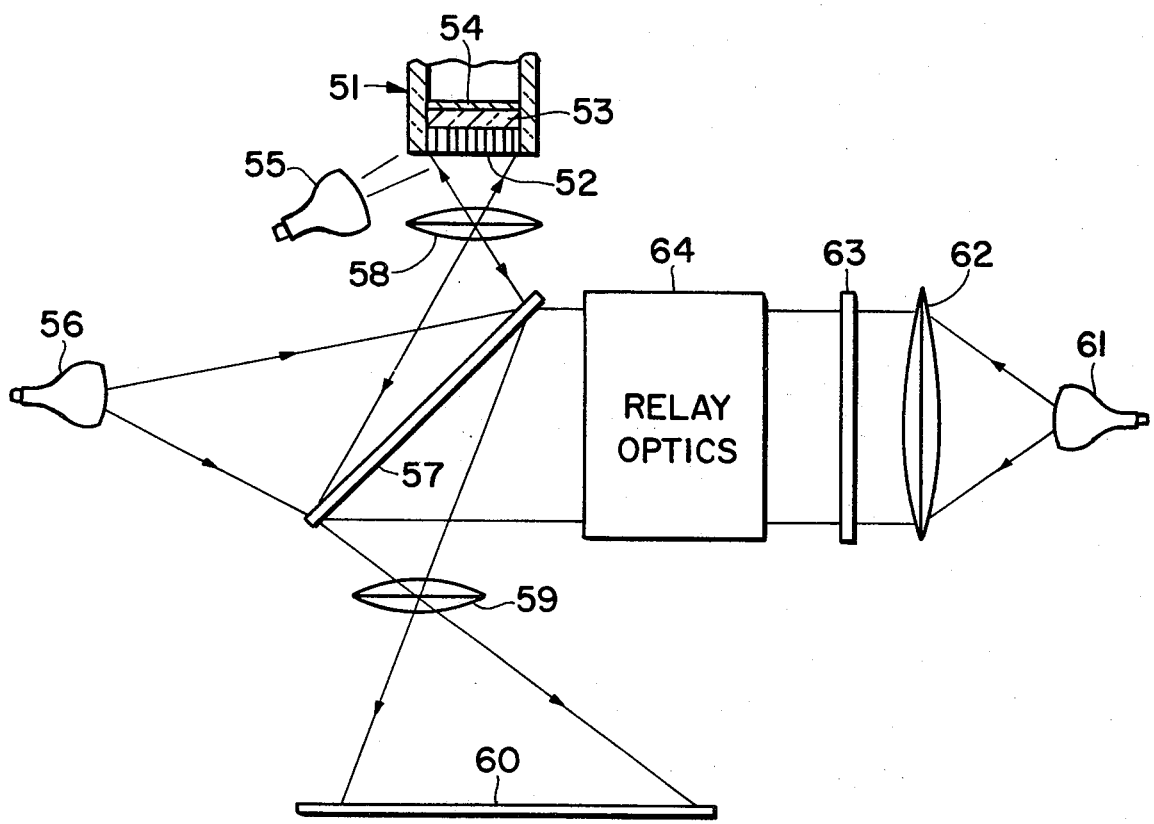
FIG. 4 is a schematic diagram illustrating an optical projection system which includes means for projecting overlay information onto the viewing screen.

In FIGS. 3 and 4 an analog storage system is shown which includes an optical system for projecting an enlarged image on a viewing screen. An important advantage arising out of the systems shown in these figures is that the brightness of an image projected on a display screen depends only on the emitted and reflected light power coming from a separate probing source and is not limited by the relatively low brightness of the phosphor on the face plate of the cathode ray tube. The electronic circuitry for controlling the deflection and focusing of the electron beam and the exact design of the projection optics are omitted from these figures.

In FIG. 3, a cathode ray tube 38 includes a photochromic fiber optic face plate 39, a dichroic layer 40 and a phosphor layer 41. The dichroic layer 40 transmits ultraviolet light having a wavelength around 380 millimicrons and reflects light having a wavelength above 450 millimicrons. Ultraviolet light generated by the phosphor layer 41 in response to an electron beam impinging thereon, activates or darkens certain portions of the face plate 39 since the dichroic layer 40 transmits ultraviolet light. When it is energized, a light source 42 floods the entire face plate 39 with light having a wavelength in the 630 millimicron range to erase information stored therein.

The analog display system of FIG. 3 includes a probing light source 43 which directs a beam of light onto the face plate 39. The wavelength of light emitted by the source 43 is around 550 millimicrons, the optimum probing frequency to provide a projected image having high contrast. Light from the source 43 passes through the face plate 39, is reflected by the dichroic layer 40 and again passes through the face plate 39. A considerable contrast enhancement is achieved by this double path technique. The light is then transmitted by the lens 44, is reflected by the mirror 45, and passes through the projection lens 46 to a front or rear view screen 47 for display purposes. The darkened area in the photochromic glass, which may form characters, vectors, curves, etc., blocks the transmission of projection light through the glass and forms a dark character on a green-yellow background.

FIG. 4 shows an arrangement similar to that in FIG. 3 with the additional application of a beam splitter which enables overlay information (which may consist of forms, maps or the like) to be projected onto a viewing screen in addition to the image coming from the photochromic face plate. The cathode ray tube 51 includes a photochromic fiber optic face plate 52, a dirchroic layer 53 and a phosphor layer 54. The erasing function is accomplished by the light source 55. A probing light source 56, having a wavelength of about 550 millimicrons, directs a beam of light which partially reflects from the beam splitter 57 and is focused onto the photochromic face plate 52 by the lens 58. After passing through the face plate 52, the probing light is reflected from the dichroic mirror 53 back through the photochromic face plate 52, and is passed by the lens 58, the beam splitter 57 and the lens 59 to the viewing screen 60. Light from an overlay light source 61 is focused by a lens 62 on an overlay information carrier 63 such as a slide, mask or the like. The overlay information beam is then transmitted by relay optics 64 to the beam splitter 57 and is projected by the lens 59 to the screen 60 along with the image from the face plate 52.

We claim:

1. An optical information storage system comprising a cathode ray tube having a face plate consisting of a plurality of light-conducting optical fibers, each fiber having a core of photochromic glass of selected refractive index and a cladding on said core of light transmitting material of relatively lower refractive index, said fibers being arranged in side-by-side parallel contacting relation to each other in a hermetically sealed bundle, a layer of phosphor adjacent said face plate within said cathode ray tube, means for directing an electron beam on said layer of phosphor, means for changing the energy level of said electron beam, output means disposed on that side of said face plate opposite said phosphor layer in light receiving relationship with respect to said face plate for generating an electrical signal that is related to the intensity of the light emerging from the fibers of said plate, and means for applying a digital input signal to said means for changing the energy level of said electron beam.

2. An optical information storage system in accordance with claim 1 which further comprises means for applying to said means for changing the energy level of said electron beam a readout bias voltage of lower intensity than that of said digital input signal.

3. An optical information storage system in accordance with claim 2 wherein said output means comprises a photo cell.

4. An optical information storage system in accordance with claim 3 which further comprises means disposed on that side of said face plate opposite said phosphor layer for directing onto said face plate light, the wavelength of which is such that it erases information stored in said face plate.

* * * * *